United States Patent
Otsubo et al.

(10) Patent No.: US 10,349,512 B2
(45) Date of Patent: Jul. 9, 2019

(54) HIGH-FREQUENCY MODULE

(71) Applicant: Murata Manufacturing Co., Ltd., Kyoto (JP)

(72) Inventors: Yoshihito Otsubo, Kyoto (JP); Issei Yamamoto, Kyoto (JP); Takuya Murayama, Kyoto (JP); Tadashi Nomura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/830,302

(22) Filed: Dec. 4, 2017

(65) Prior Publication Data

US 2018/0092201 A1     Mar. 29, 2018

Related U.S. Application Data

(63) Continuation of application No. PCT/JP2016/066434, filed on Jun. 2, 2016.

(30) Foreign Application Priority Data

Jun. 4, 2015  (JP) .................................. 2015-114207

(51) Int. Cl.
*H05K 1/02* (2006.01)
*H01L 23/00* (2006.01)
(Continued)

(52) U.S. Cl.
CPC ........... *H05K 1/0218* (2013.01); *H01L 23/00* (2013.01); *H01L 23/12* (2013.01); *H01L 23/28* (2013.01);
(Continued)

(58) Field of Classification Search
CPC ...... H05K 1/0218; H05K 1/181; H05K 1/115; H05K 9/003; H05K 3/46; H05K 3/341;
(Continued)

(56) References Cited

U.S. PATENT DOCUMENTS

| 7,876,579 B1 * | 1/2011 | Tsau ..................... H05K 9/0032<br>361/816 |
| 8,897,019 B1 * | 11/2014 | Shimamura ........... H01L 23/552<br>361/728 |

(Continued)

FOREIGN PATENT DOCUMENTS

| JP | H07-18496 U | 3/1995 |
| JP | 2007-157891 A | 6/2007 |

(Continued)

OTHER PUBLICATIONS

International Search Report for International Application No. PCT/JP2016/066434, dated Jul. 12, 2016.
Written Opinion for International Application No. PCT/JP2016/066434, dated Jul. 12, 2016.

*Primary Examiner* — Abhishek M Rathod
(74) *Attorney, Agent, or Firm* — Pearne & Gordon LLP

(57) ABSTRACT

A high-frequency module includes: a multilayer wiring board; a plurality of components mounted on an upper surface of the multilayer wiring board; a sealing resin layer laminated on the upper surface of the multilayer wiring board and sealing the plurality of components; a shield wall disposed within the sealing resin layer and between the predetermined components; and a surface layer conductor disposed between the upper surface of the multilayer wiring board and the shield wall so as to overlap the shield wall in a plan view of the multilayer wiring board. The shield wall is formed in a polyline shape having bent portions in the plan view, and has, at the bent portions, projection portions penetrating the surface layer conductor.

12 Claims, 10 Drawing Sheets

(51) Int. Cl.

| | | |
|---|---|---|
| *H01L 23/12* | (2006.01) | |
| *H01L 23/28* | (2006.01) | |
| *H01L 25/04* | (2014.01) | |
| *H01L 25/18* | (2006.01) | |
| *H05K 3/46* | (2006.01) | |
| *H01L 23/31* | (2006.01) | |
| *H01L 23/538* | (2006.01) | |
| *H01L 23/552* | (2006.01) | |
| *H01L 23/66* | (2006.01) | |
| *H01L 25/065* | (2006.01) | |
| *H05K 1/11* | (2006.01) | |
| *H05K 1/18* | (2006.01) | |
| *H05K 5/06* | (2006.01) | |
| *H05K 9/00* | (2006.01) | |
| *H01L 21/56* | (2006.01) | |
| *H01L 25/00* | (2006.01) | |
| *H05K 3/28* | (2006.01) | |
| *H05K 3/34* | (2006.01) | |

(52) U.S. Cl.
CPC ...... *H01L 23/3121* (2013.01); *H01L 23/5383* (2013.01); *H01L 23/5386* (2013.01); *H01L 23/552* (2013.01); *H01L 23/66* (2013.01); *H01L 25/04* (2013.01); *H01L 25/0655* (2013.01); *H01L 25/18* (2013.01); *H05K 1/02* (2013.01); *H05K 1/115* (2013.01); *H05K 1/181* (2013.01); *H05K 3/46* (2013.01); *H05K 5/065* (2013.01); *H05K 9/003* (2013.01); *H05K 9/0022* (2013.01); *H01L 21/56* (2013.01); *H01L 24/16* (2013.01); *H01L 24/81* (2013.01); *H01L 25/50* (2013.01); *H01L 2224/16225* (2013.01); *H01L 2224/16227* (2013.01); *H01L 2224/81801* (2013.01); *H01L 2924/181* (2013.01); *H01L 2924/19105* (2013.01); *H01L 2924/3025* (2013.01); *H05K 3/284* (2013.01); *H05K 3/341* (2013.01); *H05K 2201/093* (2013.01); *H05K 2201/10522* (2013.01); *H05K 2201/10636* (2013.01); *H05K 2201/10734* (2013.01); *H05K 2203/107* (2013.01)

(58) Field of Classification Search
CPC ............. H01L 23/5383; H01L 23/5386; H01L 23/552; H01L 23/0655; H01L 2924/181
See application file for complete search history.

(56) References Cited

U.S. PATENT DOCUMENTS

| | | | | |
|---|---|---|---|---|
| 9,055,682 B2* | 6/2015 | Mugiya | .................... | H05K 7/06 |
| 9,101,050 B2* | 8/2015 | Shimamura | .......... | H05K 1/0216 |
| 9,426,935 B2* | 8/2016 | Gao | .................... | H05K 9/0045 |
| 2004/0232452 A1 | 11/2004 | Tsuneoka et al. | | |
| 2004/0252475 A1* | 12/2004 | Tsuneoka | ............ | H01L 23/3121 361/816 |
| 2006/0258050 A1* | 11/2006 | Fujiwara | ................. | H01L 23/29 438/112 |
| 2007/0246825 A1* | 10/2007 | Oh | ...................... | H01L 23/3121 257/728 |
| 2009/0188703 A1* | 7/2009 | Ito | ..................... | H01L 23/49838 174/255 |
| 2012/0000699 A1 | 1/2012 | Inoue | | |
| 2012/0008288 A1* | 1/2012 | Tsukamoto | .......... | H05K 9/0037 361/736 |
| 2012/0320559 A1* | 12/2012 | Kimura | ................. | H01L 23/552 361/818 |
| 2013/0271928 A1* | 10/2013 | Shimamura | .......... | H05K 9/0084 361/748 |
| 2013/0301227 A1* | 11/2013 | Kawano | ................ | H01L 21/561 361/748 |
| 2014/0160699 A1* | 6/2014 | Zhang | ................... | H01L 23/552 361/752 |
| 2014/0293550 A1* | 10/2014 | Mugiya | ................ | H05K 1/0218 361/728 |
| 2015/0043170 A1* | 2/2015 | Shimamura | .......... | H01L 23/3121 361/728 |
| 2015/0043171 A1 | 2/2015 | Mugiya et al. | | |
| 2015/0043172 A1 | 2/2015 | Mugiya et al. | | |
| 2015/0043189 A1* | 2/2015 | Kitazaki | ............ | H01L 23/3121 361/816 |
| 2015/0070849 A1* | 3/2015 | Shimamura | .......... | H05K 1/0216 361/728 |
| 2015/0070851 A1* | 3/2015 | Kitazaki | ................ | H05K 3/301 361/729 |
| 2015/0171021 A1* | 6/2015 | Takano | ................... | H01L 24/97 257/659 |
| 2015/0171056 A1* | 6/2015 | Goto | ................... | H01L 25/0655 438/107 |

FOREIGN PATENT DOCUMENTS

| | | |
|---|---|---|
| JP | 2010-80968 A | 4/2010 |
| JP | 2010-225620 A | 10/2010 |
| JP | 2014-56880 A | 3/2014 |
| JP | 5622906 B1 | 11/2014 |
| JP | 2015-53298 A | 3/2015 |

* cited by examiner

PRIOR ART

HIGH-FREQUENCY MODULE

This is a continuation of International Application No. PCT/JP2016/066434 filed on Jun. 2, 2016 which claims priority from Japanese Patent Application No. 2015-114207 filed on Jun. 4, 2015. The contents of these applications are incorporated herein by reference in their entireties.

BACKGROUND

Technical Field

The present disclosure relates to a high-frequency module including: a sealing resin layer that covers a plurality of components mounted on a wiring board; and a shield wall for preventing mutual noise interference between the components.

A shield layer for blocking electromagnetic waves may be provided in a high-frequency module included in a mobile terminal device or the like. Among such a type of high-frequency modules, there is a high-frequency module in which components mounted on a wiring board is covered with a mold resin and a shield layer is provided so as to cover the surface of the mold resin.

Such a shield layer is provided for blocking noise from the outside. However, when a plurality of components is mounted on a wiring board, there is a problem that noise generated from these components interferes with other components. Therefore, hitherto, a high-frequency module in which a shield for mutually blocking noise between mounted components as well as external noise is provided has been proposed.

For example, as shown in FIG. 19, in a high-frequency module 100 disclosed in Patent Document 1, two components 102 are mounted on a wiring board 101 and sealed by a mold resin layer 103. A slit S is formed between both components in the mold resin layer 103 so as to penetrate the mold resin layer 103 and a ground electrode 105 on the wiring board 101. A shield layer 104 is formed from a conductive resin that covers the surface of the mold resin layer 103 and that fills the slit S. In addition, the conductive resin that fills the slit S is electrically connected to the ground electrode 105 formed on the wiring board 101.

In this case, the conductive resin that covers the surface of the mold resin layer 103 is able to shield the components 102 from external noise. In addition, the conductive resin that fills the slit S is also able to prevent mutual noise interference between both components 102.

The shielding characteristics of the shield layer 104 deteriorate when a problem occurs in the connection with the ground electrode 105 on the wiring board 101. However, the high-frequency module 100 is configured to assuredly achieve electrical connection between the shield layer 104 and the ground electrode 105, since the slit S penetrates the ground electrode 105.

Patent Document 1: Japanese Unexamined Patent Application Publication No. 2010-225620 (see paragraphs 0025 and 0026, FIG. 1, and the like)

BRIEF SUMMARY

In recent years, with size reduction and high functionality of such a type of high-frequency modules, there is a demand for using the mounting surface of a wiring board without waste by bending a shield for preventing mutual noise interference between components. However, since the above slit S is formed by cutting with a dicing machine, it is difficult to change the direction of the slit S in its middle. In addition, since the wiring board 101 is half-cut due to the slit S, there is a problem that the high-frequency module 100 is easily broken. Furthermore, a wiring electrode directly below the slit S in the wiring board 101 may be broken or deformed due to impact, heat, or the like during formation of the slit S.

The present disclosure has been made in view of the above-described problem, and the present disclosure provides a high-frequency module that is able to reduce deformation or breakage of an internal wiring electrode in a wiring board while improving shielding characteristics between mounted components and that allows size reduction.

A high-frequency module according to the present disclosure includes: a wiring board; a plurality of components mounted on one main surface of the wiring board; a sealing resin layer laminated on the one main surface of the wiring board and sealing the plurality of components; a shield wall disposed within the sealing resin layer and between a predetermined component and another component of the plurality of components; and a surface layer conductor disposed between the one main surface of the wiring board and the shield wall so as to overlap the shield wall in a plan view of the wiring board, and the shield wall is formed in a polyline shape having a bent portion in the plan view, and has, at the bent portion, a first projection portion penetrating the surface layer conductor.

In this case, since the shield wall is formed in a polyline shape having the bent portion in the plan view, the flexibility in arrangement of the components between which mutual noise interference is desired to be prevented by the one shield wall is increased as compared to the case where the shield wall is formed in a straight line shape in the plan view. Accordingly, it is easy to reduce the size of the high-frequency module.

Since the first projection portion penetrates the surface layer conductor, it is possible to assuredly connect the shield wall and the surface layer conductor as compared to the configuration in which the shield wall is connected to the surface layer conductor only by the shield wall being in contact with the surface of the surface layer conductor. In addition, it is possible to improve the shielding characteristics of the shield wall by the surface layer conductor forming a ground electrode for grounding, or by connecting the surface layer conductor to a ground electrode formed within the wiring board.

Since the shield wall is configured such that the first projection portion located at the bent portion penetrates the surface layer conductor, the module is less likely to be broken, and it is possible to reduce breakage or deformation of the wiring electrode formed within the wiring board, as compared to the configuration in which the entire end portion of the shield wall at the surface layer conductor side penetrates the surface layer conductor as in the case of forming the shield wall by cutting with a dicing machine in the related art.

The shield wall may further have, at a position different from that of the first projection portion in the plan view, a second projection portion penetrating the surface layer conductor. In this case, since the number of locations where the shield wall and the surface layer conductor are assuredly connected to each other is increased, the connectivity between the shield wall and the surface layer conductor further improves.

The wiring board may have a via conductor provided at a position overlapping either the first projection portion or the second projection portion in the plan view, such that the surface layer conductor is interposed between the shield wall and the via conductor, and the first projection portion or the second projection portion overlapping the via conductor in the plan view may be connected to the via conductor at an end portion thereof penetrating the surface layer conductor. In this case, it is possible to assuredly connect the via conductor and the first or second projection portion.

The via conductor may be connected to a ground electrode, for grounding, formed within the wiring board. In this case, since it is possible to assuredly connect the shield wall and the ground electrode, it is possible to stabilize the shielding characteristics of the shield wall.

The wiring board may have an internal wiring electrode provided so as to extend beyond the shield wall in the plan view, and the internal wiring electrode may be disposed so as not to overlap any of the first projection portion and the second projection portion in the plan view. For example, in the case of forming the shield wall by laser or drilling, heat or impact applied to the wiring board during processing of the shield wall is high immediately below the first and second projection portions. Thus, since the internal wiring electrode extending beyond the shield wall is disposed so as not to overlap any of the first and second projection portions, it is possible to reduce breakage or deformation of the internal wiring electrode due to formation of the shield wall.

The surface layer conductor may be provided so as to overlap a part of the shield wall in the plan view, and the part of the shield wall may include the first projection portion and the second projection portion. According to this configuration, it is possible to increase a design space, for wiring electrodes and the like, of the one main surface of the wiring board as compared to the case where the surface layer conductor is formed so as to overlap the entirety of the shield wall in the plan view.

The wiring board may be a multilayer wiring board in which a plurality of wiring layers are laminated, and the internal wiring electrode may be disposed on a wiring layer closest to the one main surface, among the plurality of wiring layers. When the internal wiring electrode is located on the wiring layer closest to the one main surface of the wiring board, the internal wiring electrode is easily influenced by heat or impact in forming the shield wall. Thus, since the internal wiring electrode is disposed so as not to overlap any of the first and second projection portions at which heat or impact in forming the shield wall is highest, it is possible to reduce breakage or deformation of the internal wiring electrode.

A protective internal conductor provided on a wiring layer just below the wiring layer on which the surface layer conductor is provided, the protective internal conductor overlapping the surface layer conductor in the plan view, may be provided, and the first projection portion may be electrically connected to the protective internal conductor. According to this configuration, it is possible to prevent damage of the layer located below the protective internal conductor.

According to the present disclosure, since the shield wall is connected to the surface layer conductor by the first projection portion penetrating the surface layer conductor, it is possible to assuredly connect the shield wall and the surface layer conductor. In addition, since the shield wall is configured to be connected at the first projection portion thereof to the surface layer conductor, the module is less likely to be broken, and it is possible to reduce breakage or deformation of the wiring electrode formed within the wiring board, as compared to the configuration in which the entire end portion of the shield wall at the surface layer conductor side penetrates the surface layer conductor as in the case of forming the shield wall by cutting with a dicing machine in the related art.

DETAILED DESCRIPTION

<First Embodiment>

Figure 1:
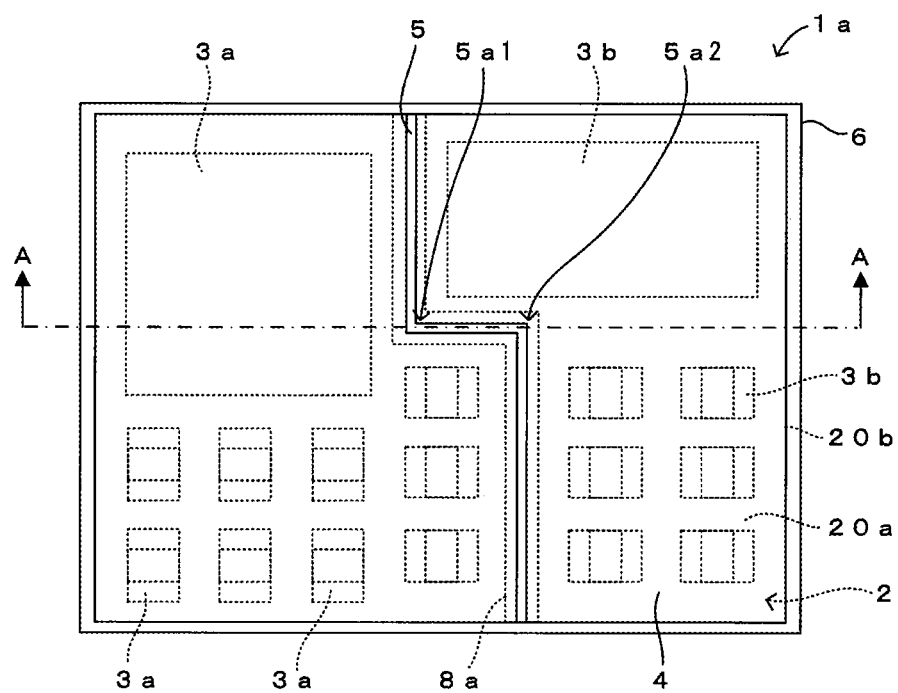
FIG. 1 is a plan view of a high-frequency module according to a first embodiment of the present disclosure.
Figure 2:
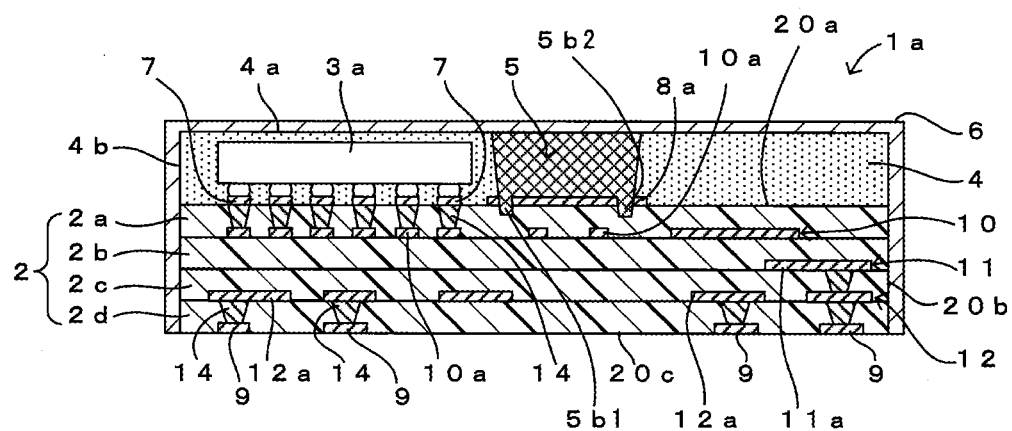
FIG. 2 is a cross-sectional view taken along the line A-A in FIG. 1.

A high-frequency module 1a according to a first embodiment of the present disclosure will be described with reference to FIGS. 1 and 2. FIG. 1 is a plan view of the high-frequency module, and FIG. 2 is a cross-sectional view taken along the line A-A in FIG. 1. In addition, in FIG. 1, a top portion of a shield film 6 is not shown.

As shown in FIGS. 1 and 2, the high-frequency module 1a includes: a multilayer wiring board 2 (corresponding to a "wiring board" of the present disclosure); a plurality of components 3a and 3b that is mounted on an upper surface 20a of the multilayer wiring board 2; a sealing resin layer 4 that is laminated on the upper surface 20a of the multilayer wiring board 2; the shield film 6 that covers the surface of the sealing resin layer 4; a shield wall 5 that is provided within the sealing resin layer 4; and a surface layer conductor 8*a* that is disposed between the upper surface 20*a* of the multilayer wiring board 2 and the shield wall 5. The high-frequency module 1*a* is mounted, for example, on a mother board of an electronic device in which a high-frequency signal is used.

The multilayer wiring board 2 includes, for example, a plurality of laminated insulating layers 2*a* to 2*d* formed from a low-temperature co-fired ceramic material or a glass epoxy resin. Mounting electrodes 7 for mounting the respective components 3*a* and 3*b* and the surface layer conductor 8*a* are formed on the upper surface 20*a* (corresponding to a "one main surface of the wiring board" of the present disclosure) of the multilayer wiring board 2, and a plurality of external electrodes 9 for external connection are formed on a lower surface 20*c* of the multilayer wiring board 2. In addition, in this embodiment, wiring layers 10 to 12 having various internal wiring electrodes 10*a* to 12*a* are disposed between the adjacent insulating layers 2*a* to 2*d*, respectively. Accordingly, the multilayer wiring board 2 has a structure in which the insulating layers 2*a* to 2*d* and the wiring layers 10 to 12 are alternately laminated. Moreover, a plurality of via conductors 14 for connecting the internal wiring electrodes 10*a* to 12*a* of the different wiring layers 10 to 12 are formed within the multilayer wiring board 2.

The mounting electrodes 7, the surface layer conductor 8*a*, the external electrodes 9, and the internal wiring electrodes 10*a* to 12*a* are each formed from a metal that is generally used for a wiring electrode, such as Cu, Ag, or Al. In addition, each via conductor 14 is formed from a metal such as Ag or Cu. Each mounting electrode 7, the surface layer conductor 8*a*, and each external electrode 9 may be each plated with Ni/Au. In addition, for example, a metal member that protects the surface layer conductor 8*a*, such as a solder film, may be joined to the surface layer conductor 8*a*.

Each of the components 3*a* and 3*b* is composed of a semiconductor element formed of a semiconductor such as Si or GaAs, or a chip component such as a chip inductor, a chip capacitor, or a chip resistor.

The sealing resin layer 4 is laminated on the multilayer wiring board 2 so as to cover the upper surface 20*a* of the multilayer wiring board 2 and the respective components 3*a* and 3*b*. The sealing resin layer 4 may be formed from a resin that is generally used as a sealing resin, such as an epoxy resin.

The shield film 6 serves to shield the various internal wiring electrodes 10*a* to 12*a* within the multilayer wiring board 2 and the respective components 3*a* and 3*b* from external noise, and is laminated on the sealing resin layer 4 so as to cover an opposite surface 4*a* of the sealing resin layer 4 that is opposite to the upper surface 20*a* of the multilayer wiring board 2, a peripheral side surface 4*b* of the sealing resin layer 4, and a side surface 20*b* of the multilayer wiring board 2. The shield film 6 is connected to a ground electrode (not shown) exposed on the side surface 20*b* of the multilayer wiring board 2.

The shield film 6 may be formed with a multilayer structure having: an adhesive film that is laminated on the surface of the sealing resin layer 4; a conductive film that is laminated on the adhesive film; and a protective film that is laminated on the conductive film.

The adhesive film is provided for enhancing adhesion strength between the conductive film and the sealing resin layer 4, and may be formed from, for example, a metal such as SUS. The conductive film is a layer responsible for a substantial shielding function of the shield film 6, and may be formed from, for example, any metal of Cu, Ag, and Al. The protective film is provided for preventing the conductive film from being corroded or damaged, and may be formed from, for example, SUS.

The shield wall 5 is disposed within the sealing resin layer 4 and between predetermined components 3*a* and 3*b*. Specifically, the shield wall 5 of this embodiment is disposed so as to divide the upper surface 20*a* of the multilayer wiring board 2 into two regions as shown in FIG. 1, and prevents mutual noise interference between the components 3*a* and 3*b* in the demarcated regions. In addition, the shield wall 5 is electrically connected at an upper end portion thereof to the top surface of the shield film 6.

The shield wall 5 is formed in a polyline shape having two bent portions 5*a*1 and 5*a*2 in a plan view of the multilayer wiring board 2 (a plan view as seen from a direction perpendicular to the upper surface 20*a* of the multilayer wiring board 2, and hereinafter referred to as plan view). In FIG. 1, the angles formed by the bent portions 5*a*1 and 5*a*2 of the shield wall 5 are each 90° in the plan view. However, in the present disclosure, the angles formed by the bent portions 5*a*1 and 5*a*2 each may not be 90°, or are not limited to an acute angle or an obtuse angle.

The surface layer conductor 8*a* is disposed between the upper surface 20*a* of the multilayer wiring board 2 and the shield wall 5 so as to overlap the shield wall 5 in the plan view. Specifically, the surface layer conductor 8*a* is formed in a line shape obtained by projecting the shield wall 5, in the plan view, and formed in a wider polyline shape than the shield wall 5. The surface layer conductor 8*a* is connected to the ground electrode (not shown), for grounding, provided on the wiring layers 10 to 12 within the multilayer wiring board 2.

A structure for connecting the shield wall 5 and the surface layer conductor 8*a* will be described. As shown in FIG. 2, projection portions 5*b*1 and 5*b*2 (corresponding to a "first projection portion" of the present disclosure) are provided on a lower end portion of the shield wall 5 and at positions overlapping the bent portions 5*a*1 and 5*a*2, respectively, in the plan view. Both projection portions 5*b*1 and 5*b*2 are formed so as to penetrate the surface layer conductor 8*a* and enter the multilayer wiring board 2, whereby the projection portions 5*b*1 and 5*b*2 are connected to the surface layer conductor 8*a*. The other portion of the lower end portion of the shield wall 5 is provided so as not to penetrate but to be in contact with the surface layer conductor 8*a*, whereby the other portion is connected to the surface layer conductor 8*a*.

The shield wall 5 is formed of, for example, a conductive paste containing a metal filler that is any of Cu, Ag, and Al. The shield wall 5 may be formed by forming a groove for the shield wall 5 on the sealing resin layer 4 by laser processing, and forming a film from a metal in the groove by using a film formation technique such as sputtering.

(Method for Manufacturing High-Frequency Module)

Next, a method for manufacturing the high-frequency module 1*a* will be described. First, the multilayer wiring board 2 on or in which the mounting electrodes 7, the surface layer conductor 8*a*, the respective wiring layers 10 to 12, and the via conductors 14 are formed, is prepared.

Next, the respective components 3*a* and 3*b* are mounted on the upper surface 20*a* of the multilayer wiring board 2 by using a known surface mount technology such as solder mounting.

Next, the sealing resin layer 4 is stacked on the upper surface 20*a* of the multilayer wiring board 2 so as to cover the respective components 3*a* and 3*b*. The sealing resin layer 4 may be formed by, for example, an application method, a print method, a transfer mold method, a compression mold method, or the like.

Next, the surface of the sealing resin layer 4 is ground or polished in order to planarize the opposite surface 4a of the sealing resin layer 4.

Next, a groove is formed by applying laser light to a portion of the sealing resin layer 4 where the shield wall 5 is to be disposed, from the opposite surface 4a side. At this time, the groove for the shield wall 5 is formed in a polyline shape having the two bent portions 5a1 and 5a2, so as to overlap the surface layer conductor 8a in the plan view. At this time, grooves from which the surface layer conductor 8a is exposed are formed as portions of the groove for the shield wall 5 other than both bent portions 5a1 and 5a2, and deep grooves that penetrate the surface layer conductor 8a are formed at both bent portions 5a1 and 5a2. For example, it is possible to adjust the depth of the groove by changing a time period for which the laser light is applied. The groove for the shield wall 5 may be formed by drilling.

In cutting with a dicing machine, it is difficult to form the groove for the shield wall 5 in a shape other than the straight line shape (the shape in the plan view) or to change the depth of the groove in the middle of cutting. On the other hand, with laser processing or drilling, it is easy to form the groove in a polyline shape or a curved line shape or to change the depth of the groove in the middle of the formation.

Next, the shield wall 5 is formed by, for example, filling the groove, which is formed in the sealing resin layer 4, with a conductive paste containing a Cu filler by an application method, a print method, or the like. At this time, the projection portions 5b1 and 5b2 are formed at the bent portions 5a1 and 5a2, at which the deep groove is formed, so as to penetrate the surface layer conductor 8a.

Next, the shield film 6 is formed so as to cover the surface (the opposite surface 4a and the peripheral side surface 4b) of the sealing resin layer 4 and the side surface 20b of the multilayer wiring board 2, by using a sputtering device or a vacuum deposition device, whereby the high-frequency module 1a is completed. The shield wall 5 may be formed by using the same film formation technology as that for the shield film 6. In this case, the groove for the shield wall 5 may be filled together during formation of the shield film 6.

Therefore, according to the above-described embodiment, since the shield wall 5 is formed in a polyline shape having the bent portions 5a1 and 5a2 in the plan view, the flexibility in arrangement of the components 3a and 3b between which mutual noise interference is desired to be prevented by the one shield wall 5 is increased as compared to the case where the shield wall 5 is formed in a straight line shape. Accordingly, it is easy to reduce the size of the high-frequency module.

Since the shield wall 5 is connected to the surface layer conductor 8a by the projection portions 5b1 and 5b2 penetrating the surface layer conductor 8a, it is possible to assuredly connect the shield wall 5 and the surface layer conductor 8a as compared to the configuration in which the shield wall 5 is connected to the surface layer conductor 8a only by the shield wall 5 being in contact with the surface of the surface layer conductor 8a. In addition, since the surface layer conductor 8a is connected to the ground electrode, it is possible to stabilize the shielding characteristics by the shield wall 5.

Since only the projection portions 5b1 and 5b2 of the shield wall 5 penetrate the surface layer conductor 8a, it is possible to reduce breakage or deformation of the internal wiring electrodes 10a to 12a of the multilayer wiring board 2 as compared to the configuration in which the entirety of the end portion of the shield wall at the surface layer conductor side penetrates the surface layer conductor as in the case of forming the shield wall by cutting with a dicing machine in the related art. In addition, the constraint that the respective internal wiring electrodes 10a to 12a have to be disposed so as not to overlap the shield wall 5 in the plan view in order to inhibit breakage or deformation of the internal wiring electrodes 10a to 12a, is reduced, and thus the flexibility in designing the internal wiring electrodes 10a to 12a is increased.

(Modifications of Shield Wall)

Figure 3:
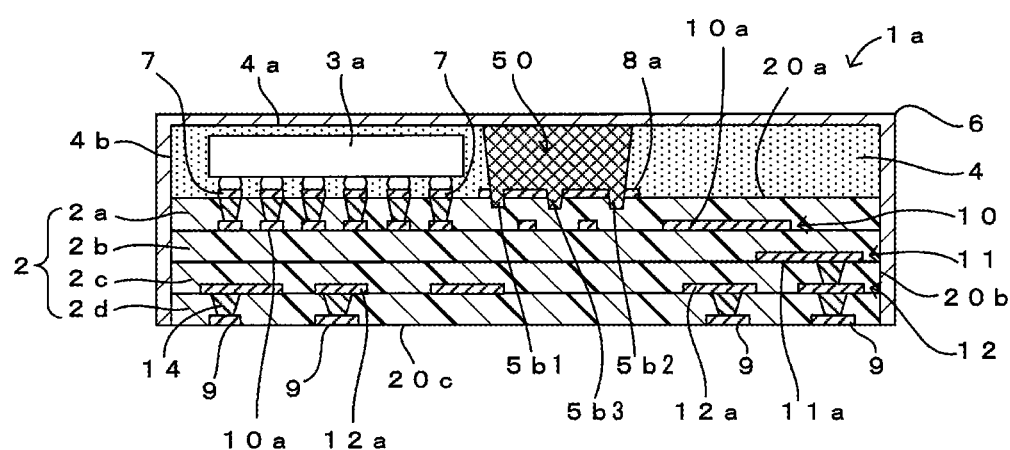
FIG. 3 is a diagram showing a modification of a shield wall in FIG. 1.
Figure 4:
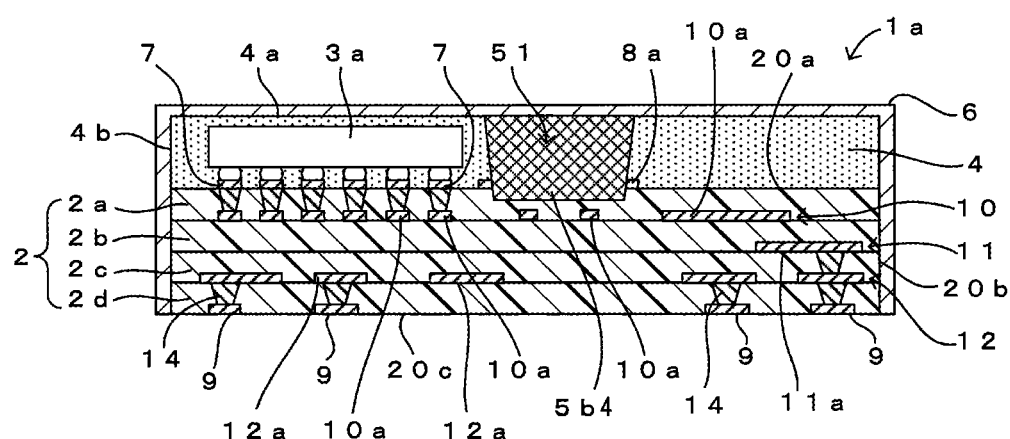
FIG. 4 is a diagram showing another modification of the shield wall in FIG. 1.

Modifications of the shield wall 5 will be described with reference to FIGS. 3 and 4. FIGS. 3 and 4 are each a diagram showing a modification of the shield wall 5 and are each a diagram corresponding to FIG. 2.

The form of the projection portions of the shield wall 5 may be changed as appropriate. For example, as shown in FIG. 3, a shield wall 50 may have, at a position different from those of the bent portions 5a1 and 5a2, another projection portion 5b3 (corresponding to a "second projection portion" of the present disclosure) penetrating the surface layer conductor 8a. In this case, since the number of locations where the shield wall 50 and the surface layer conductor 8a are assuredly connected to each other is increased, the connectivity between the shield wall 50 and the surface layer conductor 8a further improves.

As shown in FIG. 4, a projection portion 5b4 of a shield wall 51 may be provided so as to project in the entire region between both bent portions 5a1 and 5a2 in the plan view, and may penetrate the surface layer conductor 8a in this region. In this case, the region where the shield wall 51 and the surface layer conductor 8a are assuredly connected to each other is increased, and thus the connectivity between the shield wall 51 and the surface layer conductor 8a further improves.

<Second Embodiment>

Figure 5:
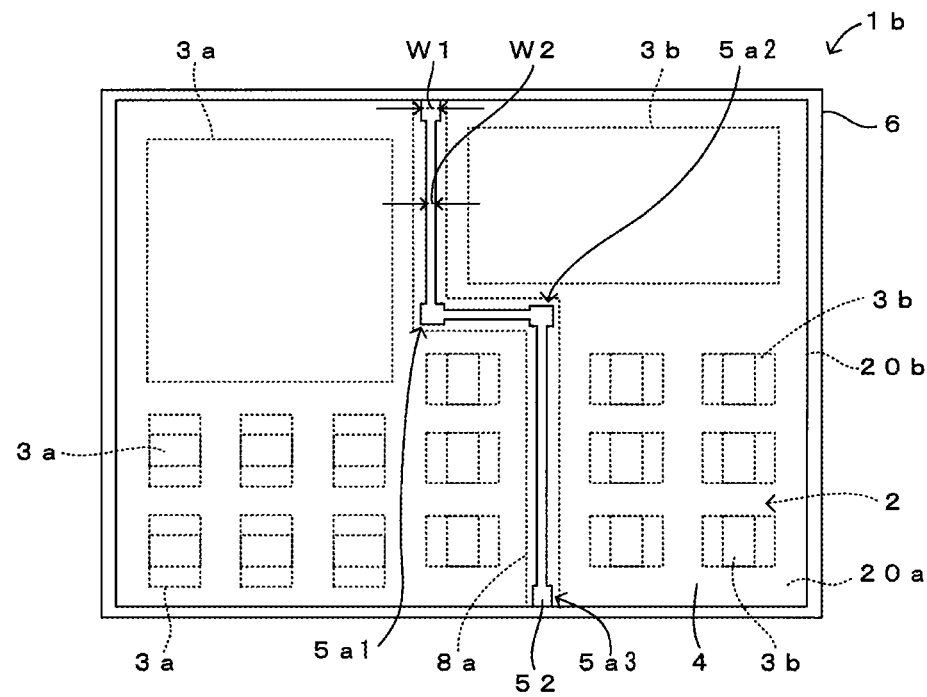
FIG. 5 is a diagram showing a high-frequency module according to a second embodiment of the present disclosure.

A high-frequency module 1b according to a second embodiment of the present disclosure will be described with reference to FIG. 5. FIG. 5 is a plan view of the high-frequency module 1b and is a diagram corresponding to FIG. 1.

The high-frequency module 1b according to this embodiment is different from the high-frequency module 1a of the first embodiment described with reference to FIGS. 1 and 2, in the shape of a shield wall 52 in the plan view as shown in FIG. 5. The other components are the same as those of the high-frequency module 1a of the first embodiment, and thus these components are designated by the same reference signs and the description thereof is omitted.

In this case, the shield wall 52 is formed such that a width W1 of end portions 5a3 and both bent portions 5a1 and 5a2 is larger than a width W2 of the other portion in the plan view. For example, in the case of forming a groove for the shield wall 52 by laser processing, the energy of applied laser light is easily increased at the end portions 5a3 and the bent portions 5a1 and 5a2 than at the other portion. Accordingly, the groove for the shield wall 52 is formed so as to be wider and deeper at the end portions 5a3 and the bent portions 5a1 and 5a2 than at the other portion. By utilizing such a phenomenon, it is possible to form the groove for the shield wall 52 without necessarily setting laser conditions in detail. In this case, a projection portion penetrating the surface layer conductor 8a may be provided at both end portions 5a3 in addition to both bent portions 5a1 and 5a2.

(Modification of Shield Wall)

Figure 6:
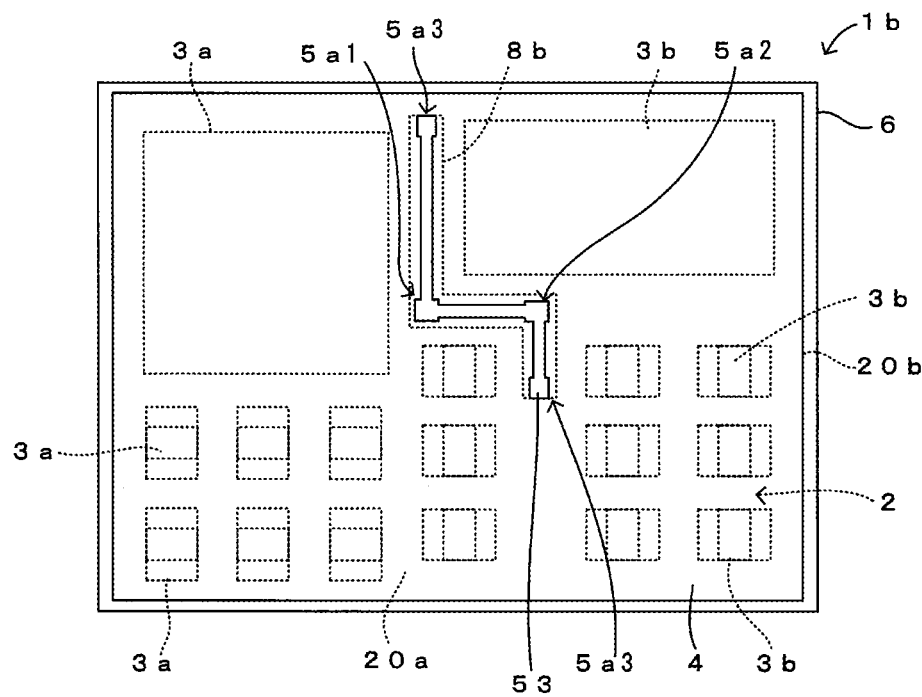
FIG. 6 is a diagram showing a modification of a shield wall in FIG. 5.

The above-described shield wall 52 is provided so as to divide the upper surface 20a of the multilayer wiring board 2 into two regions, but, for example, as shown in FIG. 6, a shield wall 53 may be provided only between components between which mutual noise interference is desired to be prevented. In this case, a surface layer conductor 8b is provided only at a portion overlapping the shield wall 53 in the plan view. With this configuration, it is possible to increase a free space of the upper surface 20a of the multilayer wiring board 2, and thus it is possible to increase the flexibility in designing the wiring electrodes and the like.

<Third Embodiment>

Figure 7:
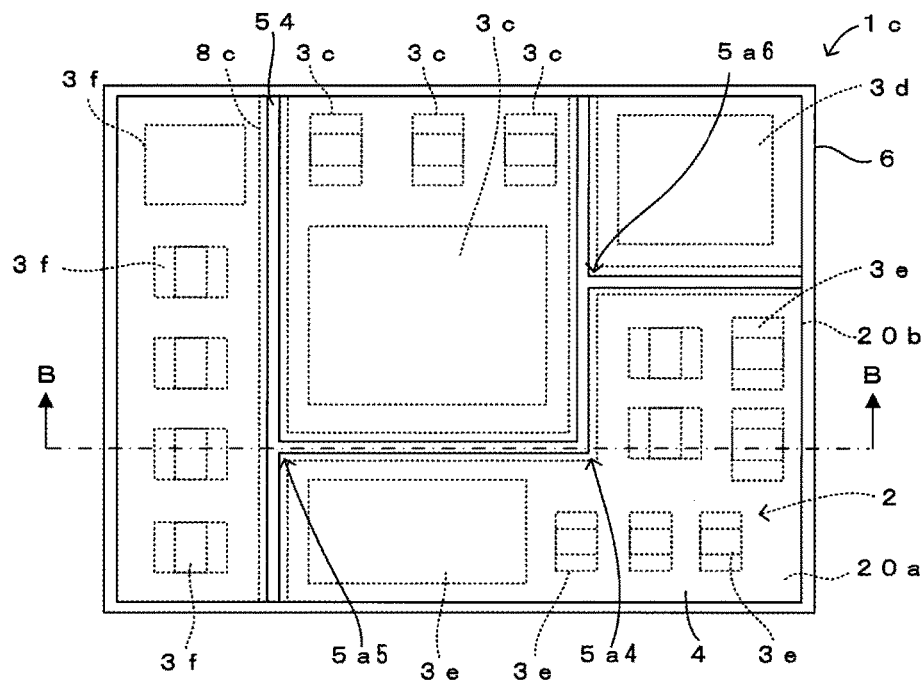
FIG. 7 is a plan view of a high-frequency module according to a third embodiment of the present disclosure.

A high-frequency module 1c according to a third embodiment of the present disclosure will be described with reference to FIGS. 7 and 8. FIG. 7 is a plan view of the high-frequency module 1c and is a diagram corresponding to FIG. 1, and FIG. 8 is a cross-sectional view taken along the line B-B in FIG. 7.

The high-frequency module 1c according to this embodiment is different from the high-frequency module 1a of the first embodiment described with reference to FIGS. 1 and 2, in the configurations of a shield wall 54 and components 3c to 3f mounted on the multilayer wiring board 2 as shown in FIG. 7. The other components are the same as those of the high-frequency module 1a of the first embodiment, and thus these components are designated by the same reference signs and the description thereof is omitted.

In this case, the shield wall 54 is provided so as to divide the upper surface 20a of the multilayer wiring board 2 into four regions. At this time, the shield wall 54 is formed in a line shape having one bent portion 5a4 and two branch portions 5a5 and 5a6. In addition, a surface layer conductor 8c is formed in a shape obtained by projecting the shield wall 54, in the plan view, so as to be wider than the shield wall 54.

Figure 8:
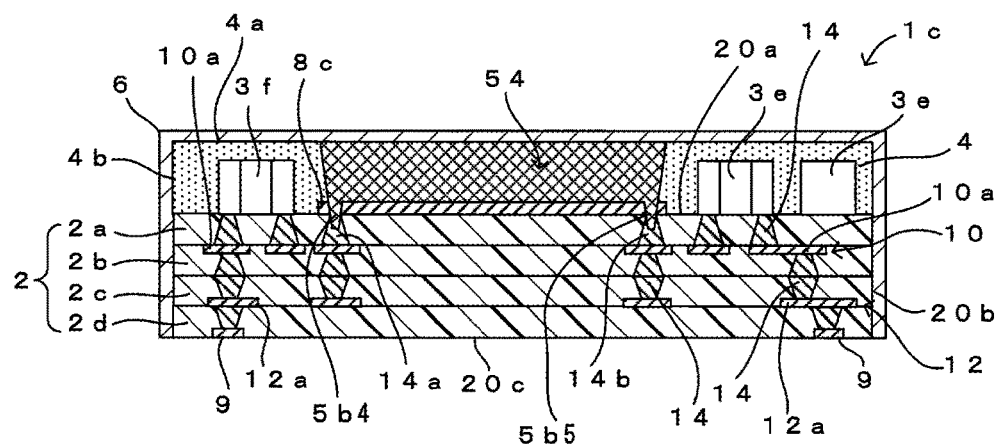
FIG. 8 is a cross-sectional view taken along the line B-B in FIG. 7.

As shown in FIG. 8, in the shield wall 54, projection portions 5b4 and 5b5 are provided at the bent portion 5a4 and both branch portions 5a5 and 5a6, respectively, so as to penetrate the surface layer conductor 8c. In addition, via conductors 14a and 14b are provided in the multilayer wiring board 2 and at positions overlapping the projection portions 5b4 and 5b5, with the surface layer conductor 8c interposed between the shield wall 54 and the via conductors 14a and 14b. The projection portions 5b4 and 5b5 are connected to the via conductors 14a and 14b, respectively, such that end portions thereof penetrating the surface layer conductor 8c enter the via conductors 14a and 14b. In addition, the via conductors 14a and 14b are connected to a ground electrode, for grounding, which is provided in the wiring layers 10 to 12 of the multilayer wiring board 2 and which is not shown. Not all the via conductors 14a and 14b need to be connected to the ground electrode, and at least one of the conductors 14a and 14b may be connected to the ground electrode.

As shown in FIG. 7, in the vicinity of both branch portions 5a5 and 5a6, the shield wall 54 has a shape obtained by combining a polyline-shaped portion and a straight portion extending from a bent point of the polyline in another direction, and thus both branch portions 5a5 and 5a6 each correspond to a "bent portion" of the present disclosure.

According to this configuration, by the via conductors 14a and 14b, it is possible to assuredly connect the shield wall 54 and the ground electrode, and it is also possible to decrease the connection resistance between the shield wall 54 and the ground electrode. In addition, the via conductors 14a and 14b are able to absorb heat or impact in forming a groove for the shield wall 54. Thus, it is possible to reduce breakage or deformation of the internal wiring electrodes 10a to 12a due to formation of the shield wall 54.

(Modifications of Shield Wall)

Figure 9:
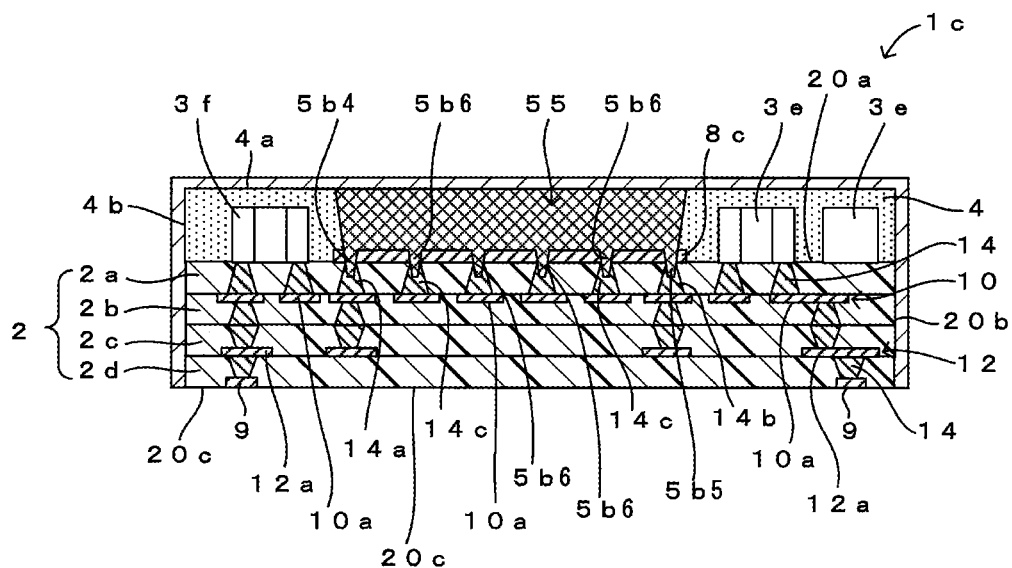
FIG. 9 is a diagram showing a modification of a shield wall in FIG. 7.
Figure 10:
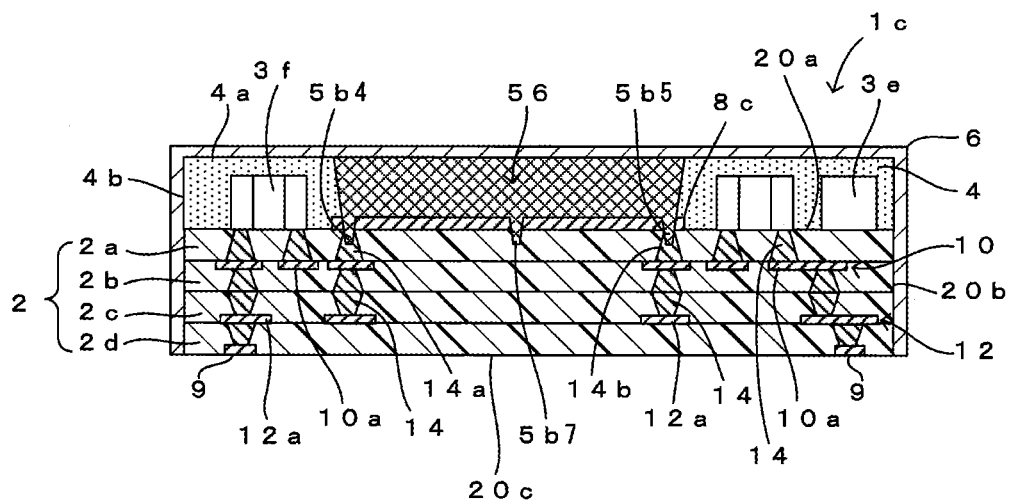
FIG. 10 is a diagram showing another modification of the shield wall in FIG. 7.

Next, modifications of the shield wall 54 will be described with reference to FIGS. 9 and 10. FIGS. 9 and 10 are diagrams showing shield walls 55 and 56 according to the examples and corresponding to FIG. 8.

For example, as shown in FIG. 9, the shield wall 55 may also have projection portions 5b6 at positions different from those of the bent portion 5a4 and the branch portions 5a5 and 5a6. In this case, a via conductor 14c that is similar to that of the shield wall 54 is provided at a position overlapping each projection portion 5b6 in the plan view of the multilayer wiring board 2. At this time, each projection portion 5b6 is connected to the via conductor 14c at an end portion thereof penetrating the surface layer conductor 8c.

According to this configuration, since the number of locations where the shield wall 55 and the surface layer conductor 8c are assuredly connected to each other is increased, the connectivity between the shield wall 55, and the surface layer conductor 8c and the ground electrode further improves. In addition, since the number of the via conductors 14a to 14c that absorb heat or impact in forming a groove for the shield wall 55 is increased, it is possible to further reduce breakage or deformation of the internal wiring electrodes 10a to 12a due to heat or impact in forming the groove.

As shown in FIG. 10, the shield wall 56 may also have a projection portion 5b7 at a position different from those of the bent portion 5a4 and the branch portions 5a5 and 5a6, and may be configured such that no via conductor is provided at a position overlapping the projection portion 5b7 in the plan view of the multilayer wiring board 2. In this case, it is possible to improve the connectivity between the surface layer conductor 8c and the shield wall 56 as compared to the shield wall 54 shown in FIG. 8.

The projection portions 5b4 and 5b5 provided at the positions overlapping the bent portion 5a4 and the branch portions 5a5 and 5a6 in the plan view each correspond to the "first projection portion" of the present disclosure, and the other projection portions 5b6 and 5b7 each correspond to the "second projection portion" of the present disclosure.

<Fourth Embodiment>

Figure 11:
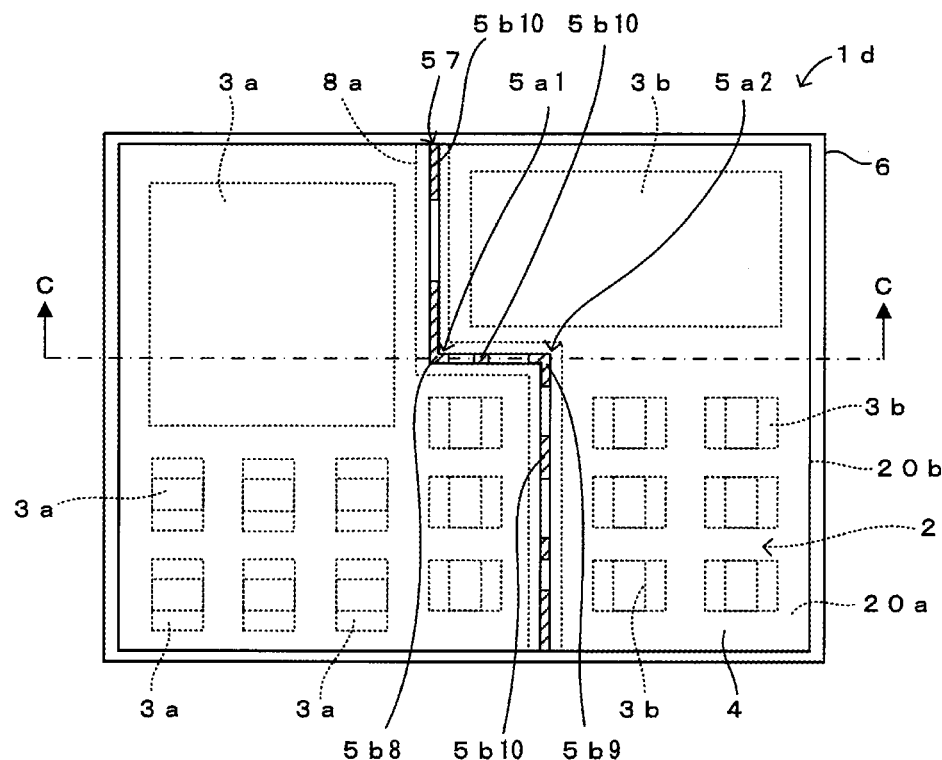
FIG. 11 is a plan view of a high-frequency module according to a fourth embodiment of the present disclosure.
Figure 12:
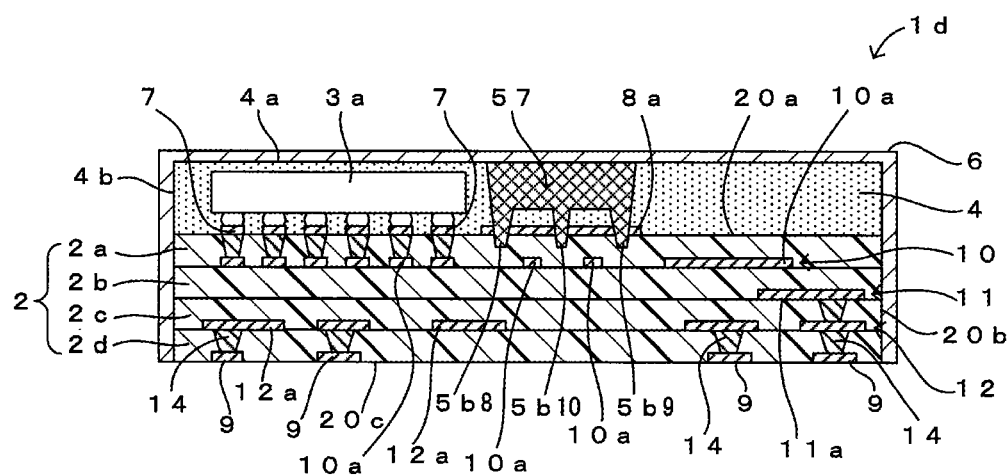
FIG. 12 is a cross-sectional view taken along the line C-C in FIG. 11.
Figure 13:
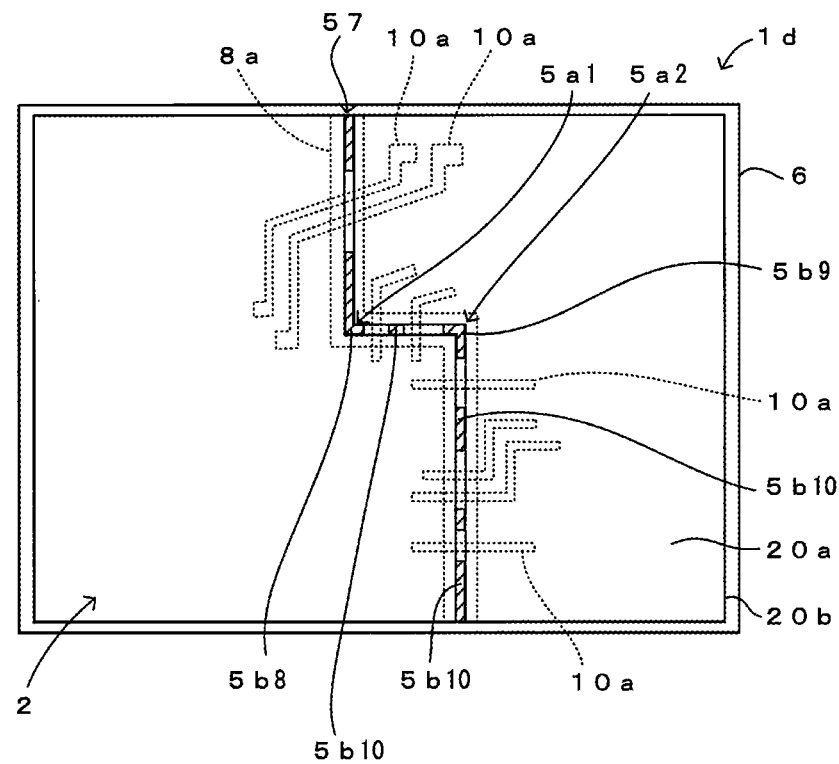
FIG. 13 is a diagram showing internal wiring electrodes in FIG. 11.

A high-frequency module 1d according to a fourth embodiment of the present disclosure will be described with reference to FIGS. 11 to 13. FIG. 11 is a plan view of the high-frequency module 1d and is a diagram corresponding to FIG. 1, FIG. 12 is a cross-sectional view taken along the line C-C in FIG. 11, and FIG. 13 is a diagram showing an example of internal wiring electrodes 10a in FIG. 11. In addition, in FIG. 13, only a shield wall 57, the surface layer conductor 8a, the shield film 6, the multilayer wiring board 2, and each internal wiring electrode 10a of a wiring layer 10 are shown, and the other components are not shown.

The high-frequency module 1d according to this embodiment is different from the high-frequency module 1a of the first embodiment described with reference to FIGS. 1 and 2, in the configuration of the shield wall 57 as shown in FIGS. 11 and 12. The other components are the same as those of the high-frequency module 1a of the first embodiment, and thus these components are designated by the same reference signs and the description thereof is omitted.

In this case, the shield wall 57 has: projection portions 5b8 and 5b9 (corresponding to the "first projection portion" of the present disclosure) provided at positions overlapping the two bent portions 5a1 and 5a2 in the plan view; and a plurality of projection portions 5b10 (corresponding to the "second projection portion" of the present disclosure) provided at positions different from those of the projection portions 5b8 and 5b9. In addition, in the shield wall 57, a gap is formed between a lower end portion of the shield wall 57 and the surface layer conductor 8a as shown in FIG. 12 at locations other than the projection portions 5b8, 5b9, and 5b10, and the resin of the sealing resin layer 4 is disposed in the gap. Oblique line portions of the shield wall 57 in FIG. 11 show locations at which the projection portions 5b8, 5b9, and 5b10 are provided.

On the uppermost wiring layer 10 close to the projection portions 5b8, 5b9, and 5b10, a plurality of the internal wiring electrodes 10a are disposed so as to extend beyond the shield wall 57 in the plan view as shown in FIG. 13. At this time, the respective internal wiring electrodes 10a are disposed so as not to overlap the projection portions 5b8, 5b9, and 5b10 in the plan view.

According to this configuration, since each internal wiring electrode 10a is disposed so as not to overlap any of the projection portions 5b8, 5b9, and 5b10 in the plan view, it is possible to reduce breakage or deformation of the internal wiring electrode 10a due to heat or impact in forming the shield wall 57. In addition, since the shield wall 57 is formed such that a gap is present between the surface layer conductor 8a and the shield wall 57 at a portion overlapping each internal wiring electrode 10a in the plan view, it is possible to reduce heat or impact applied to the internal wiring electrode 10a in forming a groove for the shield wall 57.

(Modification of Surface Layer Conductor)

Figure 14:
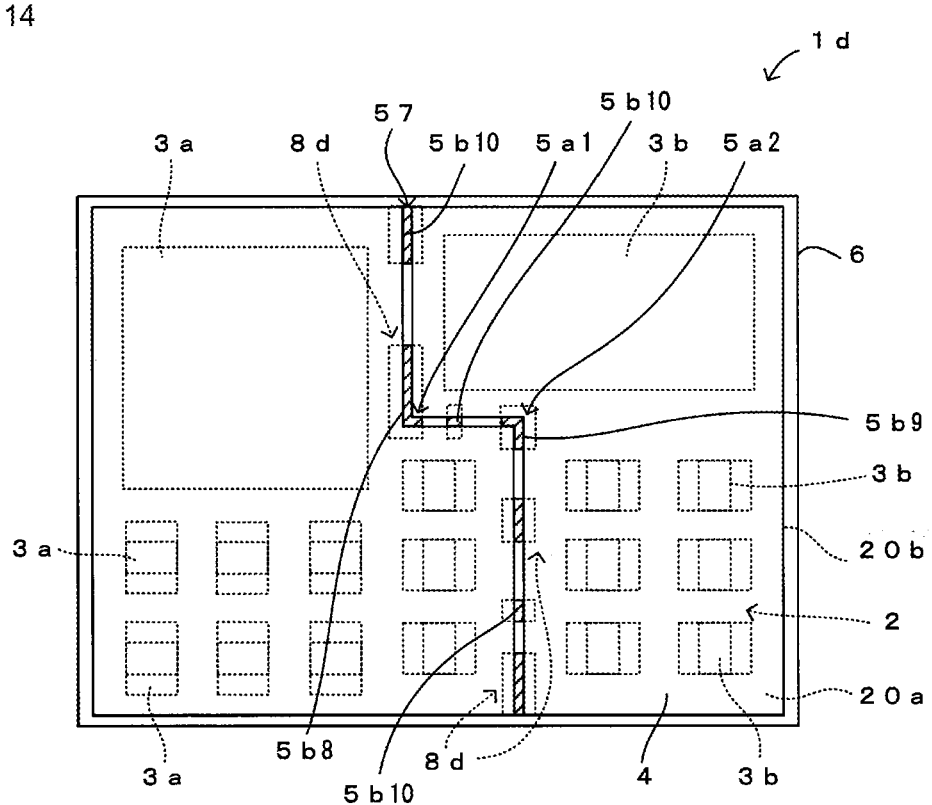
FIG. 14 is a diagram showing a modification of surface layer conductors in FIG. 11.

As long as the surface layer conductor 8a in FIG. 11 is formed at least in a region overlapping the respective projection portions 5b8 to 5b10 in the plan view, the shape of the surface layer conductor 8a in the plan view may be changed as appropriate. For example, as shown in FIG. 14, a surface layer conductor 8d is provided only in a region overlapping each of the projection portions 5b8, 5b9, and 5b10 in the plan view, which is a portion of the shield wall 57. According to this configuration, it is possible to increase a design space, for wiring electrodes and the like, of the upper surface 20a of the multilayer wiring board 2 as compared to the case where a surface layer conductor is formed so as to overlap the entirety of the shield wall 57 in the plan view.

<Fifth Embodiment>

Figure 15:
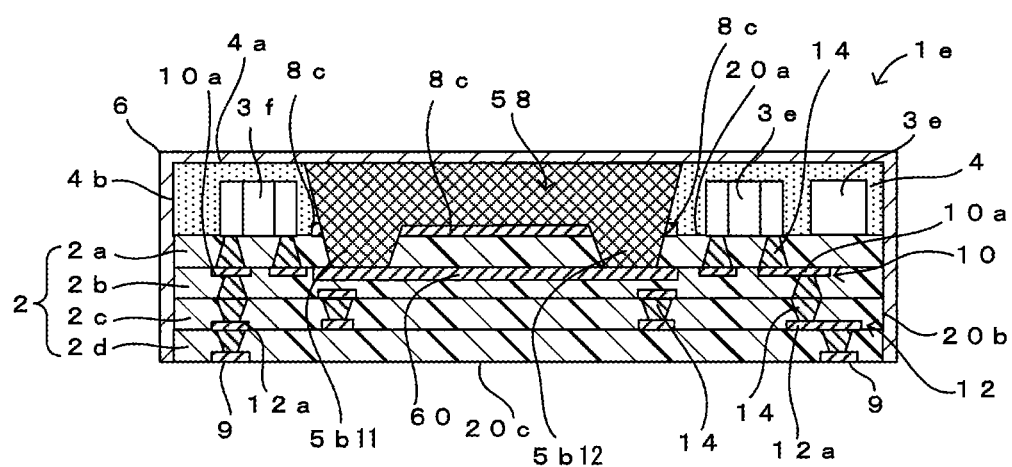
FIG. 15 is a cross-sectional view of a high-frequency module according to a fifth embodiment of the present disclosure.

A high-frequency module 1e according to a fifth embodiment of the present disclosure will be described with reference to FIG. 15. FIG. 15 is a cross-sectional view of the high-frequency module 1e and corresponds to the cross-sectional view taken along the line B-B in FIG. 7.

The high-frequency module 1e according to this embodiment is different from the high-frequency module 1c of the third embodiment described with reference to FIGS. 7 and 8, in the configuration of a shield wall 58 and in that a protective internal conductor 60 is provided. The other components are substantially the same as those of the high-frequency module 1c of the third embodiment, and thus these components are designated by the same reference signs and the description thereof is omitted.

As shown in FIG. 15, the high-frequency module 1e has a structure in which the protective internal conductor 60 partially overlapping the surface layer conductor 8c in the plan view is provided on an internal wiring layer just below an internal wiring layer (corresponding to a "wiring layer" of the present disclosure) on which the surface layer conductor 8c is provided. Projection portions 5b11 and 5b12 (corresponding to the "first projection portion" of the present disclosure) on the shield wall 58 are in contact with and electrically connected to the protective internal conductor 60 and do not penetrate the protective internal conductor 60. During manufacture, in forming a groove at a location where the shield wall 58 is to be disposed from the opposite surface 4a side of the sealing resin layer 4, the groove is formed such that the groove does not penetrate the protective internal conductor 60 to damage an insulating layer 2b located below the protective internal conductor 60. Accordingly, it is possible to prevent damage of the insulating layer 2b located below the protective internal conductor 60. As long as the projection portions 5b11 and 5b12 are electrically connected to at least the surface layer conductor 8c, the projection portions 5b11 and 5b12 may not be connected to the protective internal conductor 60.

Figure 16:
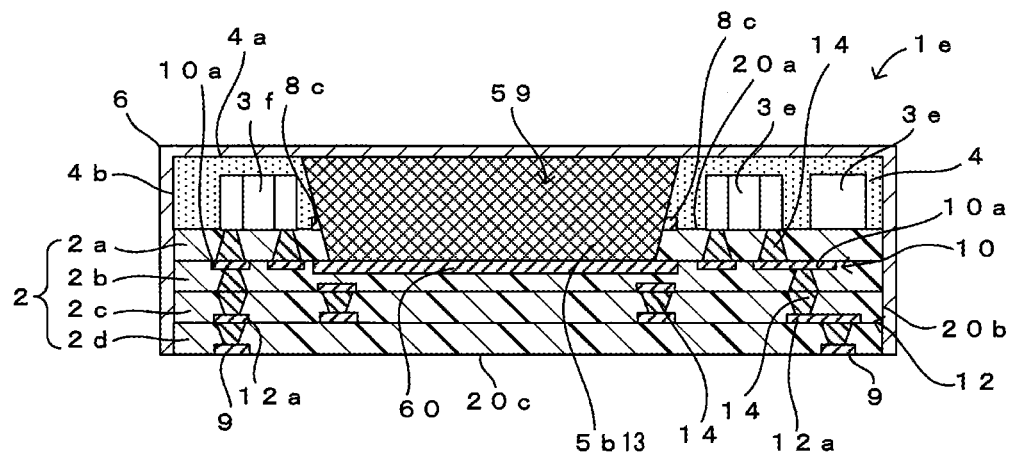
FIG. 16 is a diagram showing a modification of a shield wall in FIG. 15.

Next, a modification of the shield wall 58 will be described with reference to FIG. 16. FIG. 16 is a diagram showing the modification of the shield wall 58 and corresponds to FIG. 15.

As shown in FIG. 16, a structure is provided in which a projection portion 5b13 on a shield wall 59 is provided so as to project in the entire region between both bent portions in the plan view and does not penetrate the protective internal conductor 60 but penetrates the surface layer conductor 8c in this region. In this case, damage of the insulating layer 2b located below the protective internal conductor 60 is prevented, and the region where the shield wall 59 and the protective internal conductor 60 are assuredly connected to each other is increased, and thus the connectivity between the shield wall 59 and the protective internal conductor 60 further improves.

<Sixth Embodiment>

Figure 17:
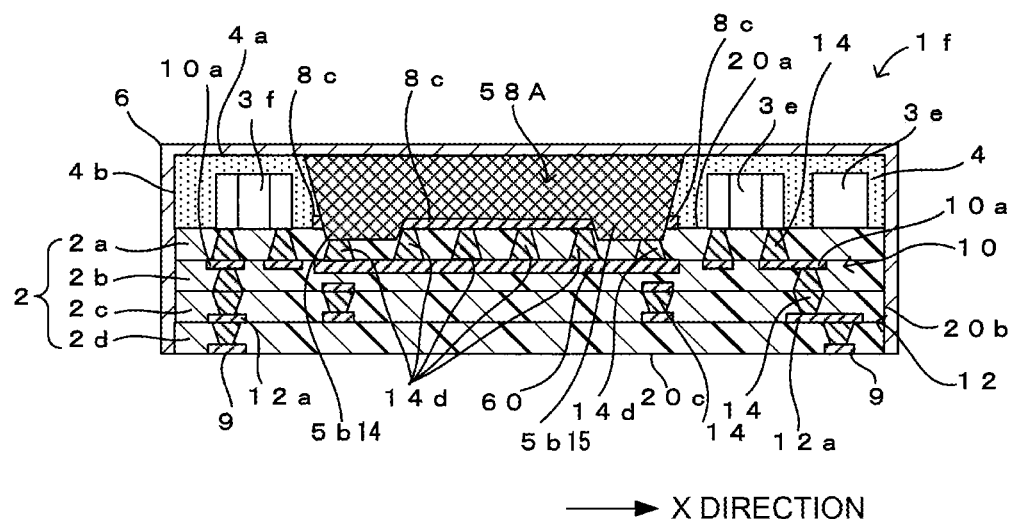
FIG. 17 is a cross-sectional view of a high-frequency module according to a sixth embodiment of the present disclosure.

A high-frequency module 1f according to a sixth embodiment of the present disclosure will be described with reference to FIG. 17. FIG. 17 is a cross-sectional view of the high-frequency module 1f and corresponds to the cross-sectional view taken along the line B-B in FIG. 7.

The high-frequency module 1f according to this embodiment is different from the high-frequency module 1e of the fifth embodiment described with reference to FIG. 15, in the configuration of a shield wall 58A and in that a plurality of via conductors 14d are formed so as to electrically connect the surface layer conductor 8c and the protective internal conductor 60. The other components are substantially the same as those of the high-frequency module 1e of the fifth embodiment, and thus these components are designated by the same reference signs and the description thereof is omitted.

As shown in FIG. 17, the high-frequency module 1f has a structure in which the protective internal conductor 60 partially overlapping the surface layer conductor 8c in the plan view is formed on the internal wiring layer just below the internal wiring layer (corresponding to the "wiring layer" of the present disclosure) on which the surface layer conductor 8c is provided, and the plurality of via conductors 14d connecting the surface layer conductor 8c and the protective internal conductor 60 are arranged along the lateral direction in FIG. 17 (an x direction shown in FIG. 17) of the surface layer conductor 8c. Projection portions 5b14 and 5b15 (corresponding to the "first projection portion" of the present disclosure) of the shield wall 58A are electrically connected to the protective internal conductor 60 via the via conductors 14d. Accordingly, the shieldability between the surface layer conductor 8c and the protective internal conductor 60 further improves.

Figure 18:
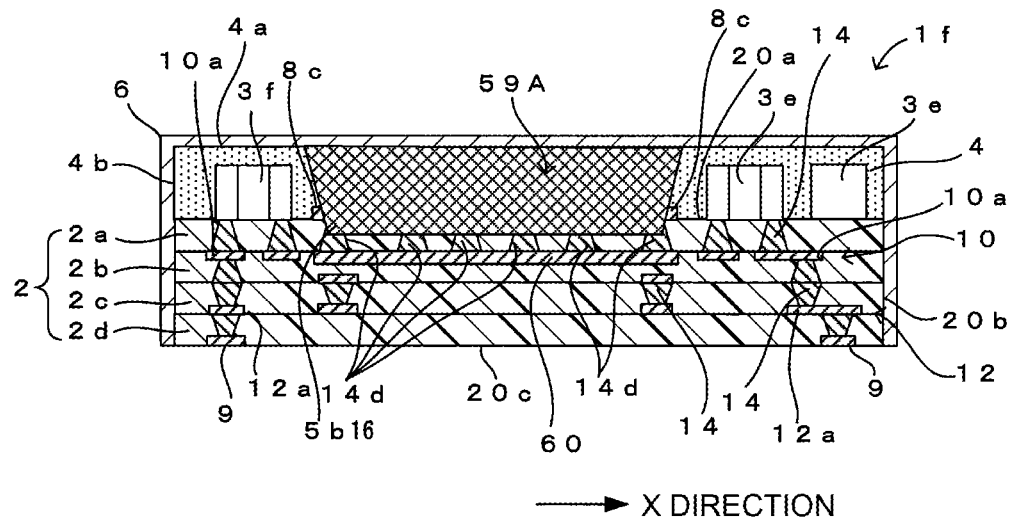
FIG. 18 is a diagram showing a modification of a shield wall in FIG. 17.
Figure 19:
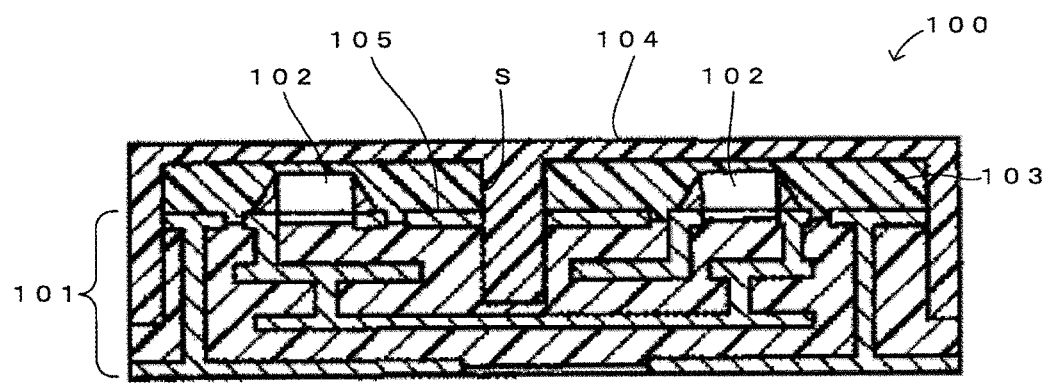
FIG. 19 is a cross-sectional view of an existing high-frequency module.

Next, a modification of the shield wall 58A will be described with reference to FIG. 18. FIG. 18 is a diagram showing the modification of the shield wall 58A and corresponds to FIG. 17.

As shown in FIG. 18, a structure is provided in which a projection portion 5b16 of a shield wall 59A is provided so as to project in the entire region between both bent portions in the plan view and does not penetrate the protective internal conductor 60 but penetrates the surface layer conductor 8c in this region. In this case, the area of connection between the shield wall 59A and the protective internal conductor 60 increases. Thus, the shieldability between the surface layer conductor 8c and the protective internal conductor 60 further improves.

The present disclosure is not limited to each embodiment described above, and various modifications other than the above may be made without departing from the gist of the present disclosure. For example, the components of each embodiment and modification described above may be combined.

Although the case where the shield walls 5 and 50 to 57 are provided so as to divide the upper surface 20a of the multilayer wiring board 2 into a plurality of regions in the plan view has been described above in the respective embodiments, for example, the shield walls 5 and 50 to 57 may be formed so as to surround predetermined components 3a to 3f.

The number of the insulating layers or the wiring layers forming the multilayer wiring board 2 may be changed as appropriate.

INDUSTRIAL APPLICABILITY

The present disclosure is applicable to various high-frequency modules including a sealing resin layer covering components mounted on a wiring board, and a shield wall that prevents mutual noise interference between the components.

REFERENCE SIGNS LIST 1a to 1d high-frequency module
2 multilayer wiring board (wiring board)
3a to 3f component
4 sealing resin layer
5, 50 to 57 shield wall
5a1, 5a2, 5a4 bent portion
5a5, 5a6 branch portion (bent portion)
5b1, 5b2, 5b4, 5b5, 5b8, 5b9 projection portion (first projection portion)
5b3, 5b6, 5b7, 5b10 projection portion (second projection portion)
8a to 8d surface layer conductor
10a internal wiring electrode
14a to 14c via conductor

The invention claimed is:
1. A high-frequency module comprising:
a wiring board;
a plurality of components mounted on one main surface of the wiring board;
a sealing resin layer laminated on the one main surface of the wiring board, the sealing resin layer sealing the plurality of components;
a shield wall disposed within the sealing resin layer and between a predetermined component and another component of the plurality of components;
a surface layer conductor disposed between the one main surface of the wiring board and the shield wall so as to overlap the shield wall in a plan view of the wiring board viewed from a direction perpendicular to the main surface of the wiring board, wherein
the shield wall is formed in a polyline shape having a bent portion in the plan view, and has, at the bent portion, a first projection portion penetrating the surface layer conductor;
wherein the shield wall further has, at a position different from that of the first projection portion in the plan view, a second projection portion penetrating the surface layer conductor; and
wherein the wiring board has an internal wiring electrode provided so as to extend beyond the shield wall in the plan view, and the internal wiring electrode is disposed so as not to overlap any of the first projection portion and the second projection portion in the plan view.

2. The high-frequency module according to claim 1, wherein the wiring board has a via conductor provided at a position overlapping either the first projection portion or the second projection portion in the plan view, such that the surface layer conductor is interposed between the shield wall and the via conductor, and the first projection portion or the second projection portion overlapping the via conductor in the plan view is connected to the via conductor at an end portion thereof penetrating the surface layer conductor.

3. The high-frequency module according to claim 2, wherein the via conductor is connected to a ground electrode, for grounding, formed within the wiring board.

4. The high-frequency module according to claim 3, wherein
the surface layer conductor is provided so as to overlap a part of the shield wall in the plan view, and
the part of the shield wall includes the first projection portion and the second projection portion.

5. The high-frequency module according to claim 3, further comprising a protective internal conductor provided on a wiring layer just below the wiring layer on which the surface layer conductor is provided, the protective internal conductor overlapping the surface layer conductor in the plan view, wherein
the first projection portion is electrically connected to the protective internal conductor.

6. The high-frequency module according to claim 2, wherein
the surface layer conductor is provided so as to overlap a part of the shield wall in the plan view, and
the part of the shield wall includes the first projection portion and the second projection portion.

7. The high-frequency module according to claim 2, further comprising a protective internal conductor provided on a wiring layer just below the wiring layer on which the surface layer conductor is provided, the protective internal conductor overlapping the surface layer conductor in the plan view, wherein
the first projection portion is electrically connected to the protective internal conductor.

8. The high-frequency module according to claim 1, wherein the surface layer conductor is provided so as to overlap a part of the shield wall in the plan view, and the part of the shield wall includes the first projection portion and the second projection portion.

9. The high-frequency module according to claim 8, further comprising a protective internal conductor provided on a wiring layer just below the wiring layer on which the surface layer conductor is provided, the protective internal conductor overlapping the surface layer conductor in the plan view, wherein
   the first projection portion is electrically connected to the protective internal conductor.

10. The high-frequency module according to claim 1, wherein the wiring board is a multilayer wiring board in which a plurality of wiring layers are laminated, and the internal wiring electrode is disposed on a wiring layer closest to the one main surface, among the plurality of wiring layers.

11. The high-frequency module according to the claim 10, further comprising a protective internal conductor provided on a wiring layer just below the wiring layer on which the surface layer conductor is provided, the protective internal conductor overlapping the surface layer conductor in the plan view, wherein
   the first projection portion is electrically connected to the protective internal conductor.

12. The high-frequency module according to claim 1, further comprising a protective internal conductor provided on a wiring layer just below the wiring layer on which the surface layer conductor is provided, the protective internal conductor overlapping the surface layer conductor in the plan view, wherein
   the first projection portion is electrically connected to the protective internal conductor.

\* \* \* \* \*

UNITED STATES PATENT AND TRADEMARK OFFICE
CERTIFICATE OF CORRECTION

PATENT NO. : 10,349,512 B2
APPLICATION NO. : 15/830302
DATED : July 9, 2019
INVENTOR(S) : Yoshihito Otsubo et al.

It is certified that error appears in the above-identified patent and that said Letters Patent is hereby corrected as shown below:

In the Specification

Column 12, Line 35 "module if" should read --module 1f--

Column 12, Line 38 "module if" should read --module 1f--

Column 12, Line 40 "module if" should read --module 1f--

Column 12, Line 51 "module if" should read --module 1f--

Signed and Sealed this
Fifteenth Day of September, 2020

Andrei Iancu
*Director of the United States Patent and Trademark Office*